Dec. 8, 1953 R. H. STAFFORD 2,662,125

AUTOMATIC GAIN CONTROL CIRCUITS FOR REDUCING AMPLITUDE VARIATIONS

Filed Feb. 20, 1950

INVENTOR.
RICHARD H. STAFFORD
BY Richard H. Stafford

Patented Dec. 8, 1953

2,662,125

UNITED STATES PATENT OFFICE 2,662,125

AUTOMATIC GAIN CONTROL CIRCUITS FOR REDUCING AMPLITUDE VARIATIONS

Richard Harland Stafford, East Orange, N. J.

Application February 20, 1950, Serial No. 145,132

1 Claim. (Cl. 179—171)

My present invention relates to an improved means for reducing amplitude variations in frequency and phase modulated waves, and more specifically to a very fast acting automatic gain control circuit for accomplishing this effect.

An important object of this invention is to provide a means for removing or substantially reducing amplitude variations from angular velocity modulated carrier waves.

Another important object of this invention is to accomplish this reduction in amplitude variations by making use of an automatic gain control circuit having a time constant small enough to follow the variations occurring in the amplitude of the carrier wave envelope.

Further objects and advantages will appear from the following detailed description taken in connection with accompanying drawings and appended claim.

This invention can best be understood by studying the following circuit descriptions, in connection with the appropriate figures.

Figure 1:
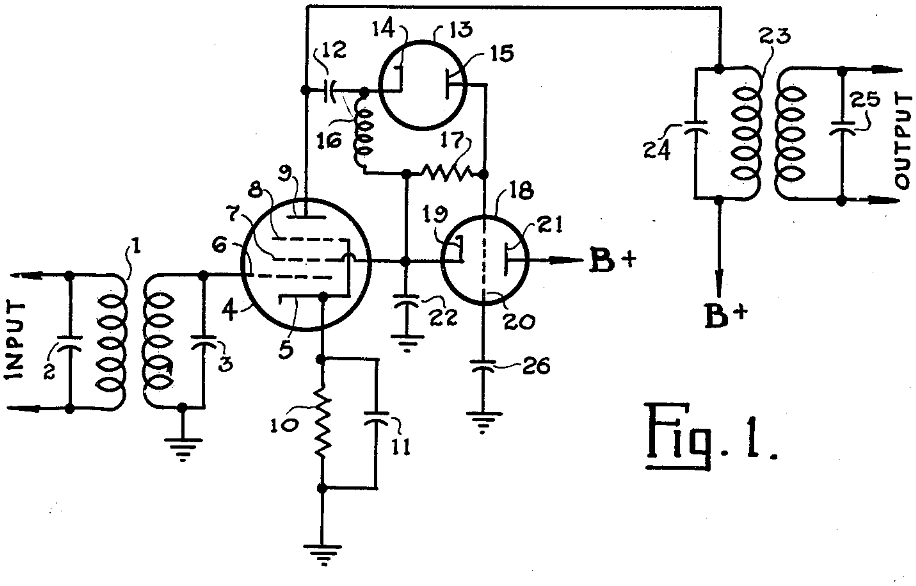
Fig. 1 shows a circuit embodying this invention and confined within one amplifier stage.

In Fig. 1 is shown a typical intermediate frequency amplifier housed in the pentode tube 4. The I. F. signal input is fed to control grid 6, in the normal manner, through I. F. transformer 1, 2 and 3 being the tuning capacitors for the primary and secondary respectively.

The I. F. amplifier is self-biased by resistor 10 and I. F. bypass capacitor 11, to that bias giving the required transconductance for a normal amplifier in that circuit position. Tube 4, therefore, operates without its normal gain being impaired. In the plate circuit of the amplifier tube the I. F. output transformer 23, tuned by capacitors 24 and 25 acts in the manner normal to amplifiers of this type.

Between the screen 7 of the amplifier tube and the B plus supply triode 18 is inserted, with its cathode 19 connected to screen 7, and its plate 21 connected to B plus.

Part of the output of the amplifier tube 4 is taken from the plate 9, through capacitor 12, and rectified by rectifier 13, the cathode of the rectifier being connected to capacitor 12, the plate to triode control grid 20. The rectifier of course need not be of the vacuum tube diode type, but may be of the semi-conductor type, such as germanium diodes or equivalents.

I. F. choke 16 is used to apply the I. F. signal across the rectifier 13. Resistor 17 is the rectifier load as well as the triode control tube grid leak. The time constant of the circuit is governed by the internal impedance of rectifier 13 which may be regarded as a resistive element, resistor 17, capacitor 22, capacitor 26, and the inter electrode capacitances of the triode and pentode.

The circuit operation is as follows: Part of the I. F. amplifier output is applied to rectifier 13, through a coupling means consisting of capacitor 12 and inductance 16. Other coupling means could have been used and still be within the meaning of this invention. The rectifier 13 has such a polarity as to negatively bias the control grid 20 of triode 18. As the signal amplitude increases the triode 18 is biased more negatively than before, which increases the D. C. resistance of the triode between cathode and plate. This increase in resistance of the triode causes a greater voltage drop to appear across it, and consequently a lower screen voltage is available for the pentode amplifier. This reduces the transconductance and gain of the amplifier stage.

Vice versa a decrease in I. F. signal amplitude through the mechanism described above, causes the screen voltage of the amplifier tube 4 to increase.

For a pure frequency or phase modulated I. F. signal, the time constant without any amplitude variations existing can be set so that it is not fast enough to impair the normal gain of the amplifier, or to cause distortion in the I. F. waves. A pure frequency or phase modulated I. F. signal is rectified by rectifier 13, and the D. C. potential developed across resistor 17 biases the control grid 20 of triode 18 by an amount which varies with the strength of the signal. As long as the signal strength remains constant the screen potential will be maintained at a constant value, and it can be said that the screen voltage has reached the equilibrium state. This equilibrium is disturbed whenever the signal strength changes, and seeks a new value of screen potential. This sort of action will be recognized as automatic gain control, and since the I. F. signal was assumed to be pure frequency or phase modulation, frequency modulation automatic gain control can be said to exist. By proper choice of values for capacitors 22 and 26, and resistor 17, screen grid 7 of tube 4 is given a time constant which is not fast enough to distort or remove the pure angular velocity modulated carrier waves due to the above mentioned automatic gain control action. The equilibrium state reached by the screen potential will be referred to later as the frequency modulation automatic gain control screen potential.

It can be assumed, now, that amplitude modulation is superimposed on the frequency or phase modulated signal. Let us assume, further, that the amplitude variation is sinusoidal. If the time constant is fast enough, during that interval in which the amplitude of the I. F. carrier increases, the amplifier screen potential will decrease simultaneously, due to the automatic gain control action described above. If the gain control action is working properly, the gain of the amplifier will be decreased by such an amount that the sinusoidal increase in the I. F. carrier wave envelope will be completely removed from the amplifier output. By the proper choice of values for capacitors 22 and 26, and resistor 17, screen grid 7 of tube 4 is given a time constant which is fast enough to allow amplitude variations due to amplitude modulation of the carrier waves to be removed or greatly reduced by the above mentioned automatic gain control action.

Vice versa, due to the control action described above a sinusoidal decrease in the I. F. carrier envelope will cause the screen potential to increase simultaneously, to remove the amplitude variations from the amplifier output.

During the complete cycle of sinusoidal variation of the amplitude of the I. F. carrier wave, then, the screen potential varies inversely with the change in signal amplitude. It is as though the gain of the tube were modulated inversely to any existing amplitude variation in the signal applied to the amplifier control grid. This sort of action has been called, in some instances, "inverse modulation." It can be seen that this, so called, "inverse modulation" of the amplifier screen occurs about a fixed reference point, which was called above the frequency modulation automatic gain control screen potential.

Figure 2A:
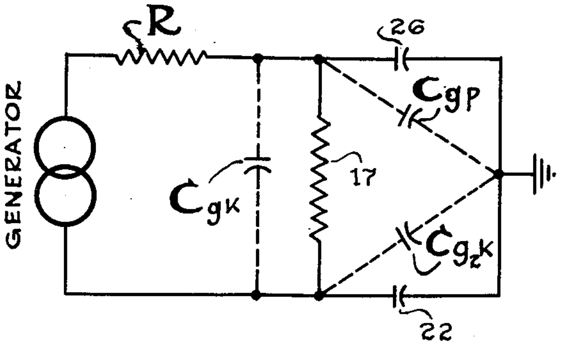
Fig. 2A shows an electrically equivalent circuit replacing the diode rectifier and the time constant means of this invention.

Refer, now, to Fig. 2A in which is shown the equivalent electrical circuit of the diode rectifier 13, in conjunction with time constant resistor 17, and time constant capacitors 22, 26, $C_{gk}$, $C_{gp}$, and $C_{g_2k}$. In Fig. 2A $C_{gk}$ refers to the grid to cathode tube capacitance of the triode 18 control tube, $C_{gp}$ refers to the grid to plate capacitance of the control tube 18, and $C_{g_2k}$ refers to the cathode to screen grid capacitance of amplifier tube 4.

Figure 2B:
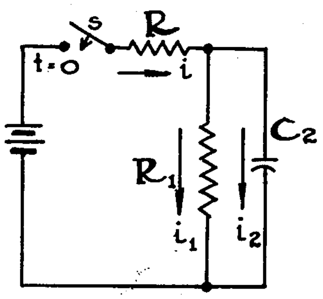
Fig. 2B shows a simplified version of Fig. 2A, simplified for use as a basis for mathematically deriving the time constant equation for this invention.

This equivalent circuit is reduced still further in Fig. 2B, in which R represents the internal impedance of diode rectifier 13, $R_1$ the diode load resistor and $C_2$ the sum of all capacitances across resistor 17 in Fig. 2A. It will be noted in Fig. 2A that all capacitors shown are ultimately in parallel with resistor 17.

Let us resort to transient analysis to determine the time constant of Fig. 2B:

$$i=i_1+i_2 \qquad (1)$$

$$Ri=E-R_1i_1 \qquad (2)$$

$$R_1i_1-\frac{\int_0^t i_2\,dt}{C_2}=0 \qquad (3)$$

The charge of the capacitor at time equal to zero, $Q_{C_2,0}$ is assumed equal to zero.

Substituting for $i$ in Equation 1 we get:

$$Ri_2+(R+R_1)i_1=E \qquad (4)$$

And from Equation 3:

$$i_2=R_1C_2\frac{di_1}{dt} \qquad (5)$$

$$(R+R_1)i_1+RR_1C_2\frac{di_1}{dt}=E \qquad (6)$$

And:

$$i_1=\frac{E}{R+R_1}\left[1-\epsilon^{-\frac{(R+R_1)}{RR_1C_2}t}\right] \qquad (7)$$

The time constant comes from the term $$\left(\epsilon^{-\frac{(R+R_1)}{RR_1C_2}t}\right)$$

and is the reciprocal of the exponential multiplier of "$t$," according to electrical transients theory. The time constant is, therefore, $$t_c=\frac{RR_1C_2}{(R+R_1)}$$

The shunt capacitance $C_2$, of Fig. 2B, is responsible for retarding the growth of the current in the $i_1$ branch, and causes the $R_1i_1$ drop to lag the sudden application of potential difference. When the switch S is closed capacitance $C_2$ charges slowly through resistor R and simultaneously retards the growth of current through resistor $R_1$.

A reversal in R. F. voltage is equivalent to shorting out the battery in Fig. 2B. This may be shown by leaving the switch S closed and instantaneously shorting out the battery. At the instant of time in which this is done the charge stored in capacitance $C_2$ starts to discharge slowly through resistors R and $R_1$ in parallel. The discharge time constant is equal to:

$$t_c=\frac{RR_1C_2}{(R+R_1)}$$

which is the same equation as derived for the charging time constant.

The sum of the charge and discharge time constants is therefore twice that of the charging time constant. The rectified direct current potential from diode plate 15 follows the variations in amplitude of the FM carrier wave applied to the diode input cathode 14, without being retarded by the charge and discharge time constants involved because the time constant thus developed is much faster in time than the rise and fall of any amplitude variations in the FM carrier signal.

Now that the time constant means has been established let us return to Fig. 2A. The control of the time constant depends on the size of resistor 17, and the sizes of capacitances 22 and 26, plus the tube inter-electrode capacitances. It can be seen that capacitances 22 and 26 are in series, therefore, their combined capacitance can never be greater than the smaller capacitance value.

Let us now assume some practical values of resistance and capacitance to be used as an example:

Let resistor 17 be 50,000 ohms.
Let capacitor 22 be $1{,}000\times10^{-12}$ farads.
Let capacitor 26 be zero farads.
Let the control tube be a 6C4.
Let the amplifier tube be a 6AK5.
From the tube books:
- $C_{gp}$ will be $1.6\times10^{-12}$ farads.
- $C_{gk}$ will be $1.8\times10^{-12}$ farads.
- $C_{g_2k}$ will be negligible compared to capacitor 22.

Resistor R, according to theory is approximately equal to one-half the diode load resistance, in this case 25,000 ohms.

The series equivalent capacitance will be the series equivalent of $C_{gp}$ and capacitor 22, and will be $1{,}000\times10^{-12}$ farads in series with $1.6\times10^{-12}$ farads, or approximately $1.6\times10^{-12}$ farads. This series equivalent must be added to the $1.8\times10^{-12}$ farads of $C_{gk}$ to give a total capacitance of $3.4\times10^{-12}$ farads. Now the time constant is:

$$t_c=\frac{2RR_1C_2}{(R+R_1)}=\frac{2\times25{,}000\times50{,}000\times3.4\times10^{-12}}{25{,}000+50{,}000}$$

$$t_c=2\times0.0568\times10^{-6}\text{ seconds}$$

$$f=\frac{1}{t_c}=\frac{10^6}{2\times0.0568}=8.3\times10^6$$

$$f=8.3\text{ megacycles}$$

If, now, resistor 17 is increased in value and capacitors 22 and 26 are given high values of capacitance, the time constant could be made very slow.

In practical cases capacitor 22 may be given that value of capacitance which is optimum as an I. F. screen bypass, and capacitor 26 may be chosen as the time constant controlling element in conjunction with the resistance value given to resistor 17. By proper choice of values for capacitors 22 and 26 and resistor 17, screen grid 7 of tube 4 is given a time constant means which is controllable.

What I claim is:

In combination with an amplifier having a cathode, an anode, a control grid, a screen grid, a suppressor grid, said cathode being connected through a self-bias resistor paralleled by a by-pass capacitor to ground potential, tuned input and output circuits, said tuned input circuit connected to said control grid and said tuned output circuit connected to said anode, and angular velocity modulated carrier wave input signals, being further combined with a signal responsive diode rectifier, and a control tube having a cathode, a control grid, and an anode, said rectifier having its anode directly connected to the control grid of said control tube, and its cathode connected through a suitable coupling means to the anode of said amplifier and the cathode of said control tube, said coupling means being parallelled to the anode of said amplifier by said tuned amplifier output circuit, said control tube being responsive to bias voltages developed from the output of said rectifier, said control tube being connected between a positive source potential and the amplifier screen grid, the anode of said control tube connected to a positive source potential, the cathode of said control tube connected to the screen grid of said amplifier tube, a resistor serving in common as diode rectifier load and control tube grid leak said resistor being connected between said cathode and control grid of said control tube, two capacitors connected in series across said resistor in such a manner that the connection between the two said capacitors is at ground potential, said resistor and capacitors forming in conjunction with the internal impedance of said diode rectifier and the inter-electrode capacitances of the amplifier tube and the control tube a time constant circuit, said coupling means including capacitive means for applying part of the amplifier output energy to the diode rectifier, the polarity of said diode rectifier being such that an increase in carrier wave amplitude causes a control tube bias increase, a control tube resistance increase, and a corresponding decrease in amplifier tube screen potential, and vice versa for a decrease in carrier wave amplitude, said action constituting automatic gain control by varying the transconductance of the amplifier tube, the diode load resistor and the two series capacitors having values selected to afford a screen grid bias circuit for the amplifier tube having a time constant which is fast enough to allow amplitude variations due to amplitude modulations of the carrier waves to be removed or greatly reduced by the above mentioned automatic gain control action, yet not fast enough to distort or remove the pure angular velocity modulated carrier waves due to the above mentioned automatic gain control action.

RICHARD H. STAFFORD.

References Cited in the file of this patent

UNITED STATES PATENTS

| Number | Name | Date |
|---|---|---|
| 1,916,129 | Schade | June 27, 1933 |
| 2,185,612 | Trevor | Jan. 2, 1940 |
| 2,428,039 | Royden | Sept. 30, 1947 |
| 2,466,229 | Goldberg | Apr. 5, 1949 |